United States Patent
Coenen et al.

(10) Patent No.: US 9,918,172 B1
(45) Date of Patent: Mar. 13, 2018

(54) ACTIVE OUTPUT DRIVER SUPPLY COMPENSATION FOR NOISE REDUCTION

(71) Applicant: SEMICONDUCTOR COMPONENTS INDUSTRIES, LLC, Phoenix, AZ (US)

(72) Inventors: Ivo Leonardus Coenen, Coffrane (CH); Alexander Heubi, La Chaux-de-Fonds (CH)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/242,358

(22) Filed: Aug. 19, 2016

(51) Int. Cl.
*H04R 29/00* (2006.01)
*H04R 25/00* (2006.01)

(52) U.S. Cl.
CPC ............. *H04R 29/00* (2013.01); *H04R 25/43* (2013.01); *H04R 2201/028* (2013.01); *H04R 2460/01* (2013.01)

(58) Field of Classification Search
CPC .. H04R 25/43; H04R 29/00; H04R 2201/028; H04R 2460/01; H03F 1/303; H03F 1/304; H03F 3/217; H03F 3/2173; H03F 2200/331
See application file for complete search history.

(56) References Cited

U.S. PATENT DOCUMENTS

| | | |
|---|---|---|
| 5,559,467 A | 9/1996 | Smedley |
| 6,344,811 B1 | 2/2002 | Melanson |
| 6,518,838 B1 | 2/2003 | Risbo |
| 6,943,620 B2 | 9/2005 | Andersen et al. |
| 7,436,255 B2 | 10/2008 | Kost et al. |
| 2004/0228416 A1* | 11/2004 | Anderson ............. H03F 3/2175 375/247 |
| 2007/0110260 A1 | 5/2007 | Hsieh et al. |

(Continued)

FOREIGN PATENT DOCUMENTS

| | | |
|---|---|---|
| EP | 0587945 A1 | 3/1994 |
| WO | 2004062089 A2 | 7/2004 |

OTHER PUBLICATIONS

Randy Boudreaux, "Real-Time Power Supply Feedback Reduces Power Conversion Requirements for Digital Class D Amplifiers," AES 27th International Conference, Copenhagen, Denmark, Sep. 2-4, 2005, pp. 1-6.

(Continued)

*Primary Examiner* — Mark Fischer
(74) *Attorney, Agent, or Firm* — Conley Rose, P.C.

(57) ABSTRACT

An electronic system, in some embodiments, comprises: a power source; a load coupled to the power source; an analog-to-digital converter, coupled to the power source and the load, that samples a fluctuating voltage supplied by the power source and generates a digital representation of said fluctuating voltage; control logic, coupled to the analog-to-digital converter, that generates an amplitude correction signal based on said digital representation of the fluctuating voltage and on a target voltage; correction logic, coupled to the control logic, that uses the amplitude correction signal and an audio signal to generate a switch control signal; and an output driver, coupled to the correction logic, that controls coupling between the power source and the load based on the switch control signal.

21 Claims, 7 Drawing Sheets

(56) References Cited

U.S. PATENT DOCUMENTS

2011/0080219 A1     4/2011   Young, III et al.
2014/0341393 A1     11/2014   Lin

OTHER PUBLICATIONS

Wikipedia, "Class-D amplifier," https://en.wikipedia.org/wiki/Class-D_amplifier, printed on Aug. 19, 2016, pp. 1-5.
Partial European Search Report for counterpart application No. EP 17179836, dated Jan. 8, 2018, 4 pages.

* cited by examiner

ACTIVE OUTPUT DRIVER SUPPLY COMPENSATION FOR NOISE REDUCTION

BACKGROUND

Hearing aids and other portable audio devices often use Class D output drivers due to their high power efficiencies. Since the output signal of an output driver is directly modulated by the supply voltage, this voltage should be free of disturbances. In hearing aids and other portable audio devices, this may not be possible as the power supply is often a small battery, which is also used to power circuits with a non-constant current load such as a wireless transmitter/receiver or a microphone. If such a variable current draw is active, it can cause the battery voltage to vary over time and thus produce fluctuations. One consequence is that the audio performance of the output driver can degrade significantly. A person wearing such a device may hear unwanted abrupt variations in volume, clicks, or other noises. Adding filtering components or a larger battery to a portable audio device negatively affects size, portability, and wearability.

SUMMARY

At least some embodiments are directed to an electronic system, comprising: a power source; a load coupled to the power source; an analog-to-digital converter, coupled to the power source and the load, that samples a fluctuating voltage supplied by the power source and generates a digital representation of said fluctuating voltage; control logic, coupled to the analog-to-digital converter, that generates an amplitude correction signal based on said digital representation of the fluctuating voltage and on a target voltage; correction logic, coupled to the control logic, that uses the amplitude correction signal and an audio signal to generate a switch control signal; and an output driver, coupled to the correction logic, that controls coupling between the power source and the load based on the switch control signal. These embodiments may be supplemented using one or more of the following concepts, in any order and in any combination: wherein said output driver comprises a Class-D amplifier; further comprising a variable current load that causes said fluctuating voltage to fluctuate; wherein the correction logic comprises a sigma-delta modulator; wherein the output driver comprises an H-Bridge circuit; wherein the switch control signal is a digital 1-bit bit stream; further comprising a voltage regulator, coupled between the power source and the load, to provide the load with a regulated voltage that is less than voltages between which the fluctuating voltage fluctuates; wherein the voltage regulator is disabled when a variable current load in the system is disabled, and wherein the voltage regulator is enabled when said variable current load is enabled; wherein the control logic generates the amplitude correction signal based at least in part on an extrapolation of multiple digitized samples of the fluctuating voltage; wherein the control logic generates the amplitude correction signal at least in part by determining or approximating a ratio of said digital representation and a nominal voltage from the power source.

At least some embodiments are directed to an electronic system, comprising: a variable current load; a power source, coupled to the variable current load, that provides a fluctuating voltage due at least in part to the variable current load; a second load; one or more switches to control coupling between the power source and the second load; a sampling system, coupled to the second load, to sample a voltage provided to the second load; and a comparator, coupled to the sampling system, that uses the sampled voltage and a reference voltage to generate a switch control signal that controls the one or more switches. Some of these embodiments may be supplemented using one or more of the following concepts, in any order and in any combination: wherein the one or more switches comprise n-type metal oxide semiconductor field effect transistor (n-MOSFET) switches; wherein the sampling system comprises a sample and hold switch and at least one capacitor; wherein the sampling system samples the voltage provided to the second load comprises positive and negative signal levels as referenced to 0 volts and wherein the sampling system only samples the positive signals; wherein the second load is an audio speaker; wherein the electronic system is a hearing aid device that is at least partially inserted into a human ear; wherein the power source is a portable source such as a battery; further comprising a voltage regulator, coupled in between the power source and the output driver, to provide the second load with a regulated voltage that is less than voltages between which the fluctuating voltage fluctuates.

At least some embodiments are directed to an audio noise reduction method, comprising: taking a first measurement of a power source voltage at a first time; taking a second measurement of said power source voltage at a second time; calculating a rate of change based on said first and second voltage measurements; predicting a future power source voltage based on said rate of change; generating an amplitude correction signal based on the future power source voltage and a target load voltage; generating a switch control signal using the amplitude correction signal and an audio signal; and controlling one or more switches using the switch control signal to regulate the provision of power to a load. Some of these embodiments may be supplemented using one or more of the following concepts, in any order and in any combination: further comprising using one or more decoupling capacitors in tandem with said power source; further comprising using a voltage regulator to maintain said power provided to the load at a level that is less than the voltage range within which the power source voltage fluctuates.

Figure 1:
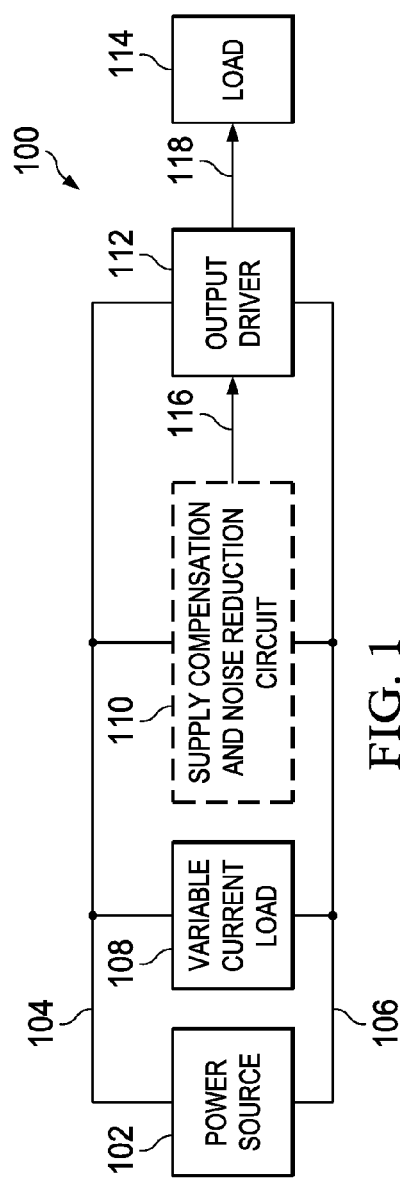
FIG. 1 is a block diagram of a portable audio device containing a supply compensation and noise reduction system.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

FIG. 1 is a block diagram of a portable audio device electronic system 100 (e.g., an electronic system within a hearing instrument, such as a hearing aid). The system 100 includes a portable power source 102, a supply voltage line 104 ("supply voltage") coupled to the power source 102, a supply voltage return line 106 also coupled to the power source 102, a variable current load 108, a supply compensation, noise reduction and modulation circuit 110, an output driver 112, and a load 114. The power source 102 may be, but is not limited to, a battery, either rechargeable or replaceable, designed to produce a predetermined supply voltage 104 at a given current, and it is limited in its response to changing current loads. In some embodiments, one may include one or more decoupling capacitors (not specifically shown in FIG. 1) in parallel with the power source 102 to minimize instantaneous changes to the supply voltage 104 and to "smooth out" the supply voltage 104 fluctuations over time.

The variable current load 108, which is coupled to the power source 102, may include a wireless transmitter, a wireless receiver, or a microphone. Its current requirements may vary with time due to changes in the audio signal strength, internal functions of the variable current load 108 being enabled and disabled, and range of frequencies employed. The variable current load 108 may vary during periods of heavy usage as compared to quiescent times, for example when the transmitter/receiver is not in use or when the microphone is not receiving any signals. These factors cause the supply voltage 104 to vary due to the small size and limited capacity of the power source 102. These variations are introduced to the output driver 112 and load 114, which causes the aforementioned problem of degradation in audio performance.

The circuit 110 compensates for these fluctuations in supply voltage. Described in detail below, the circuit 110 generates a switch control signal 116 (e.g., a 1-bit digital bit stream) based on time-dependent changes to the supply voltage 104 and provides the signal 116 to the output driver 112. The output driver 112 contains switches that are controlled by the switch control signal 116. The collective status of these switches generates an output load signal 118 to drive the load 114. The circuit 110 may also reduce noise in the audio frequency range with a sigma-delta modulator (SDM) that pushes noise into frequency bands (e.g., above approximately 20 kHz) that are inaudible to the human ear.

Figure 2:
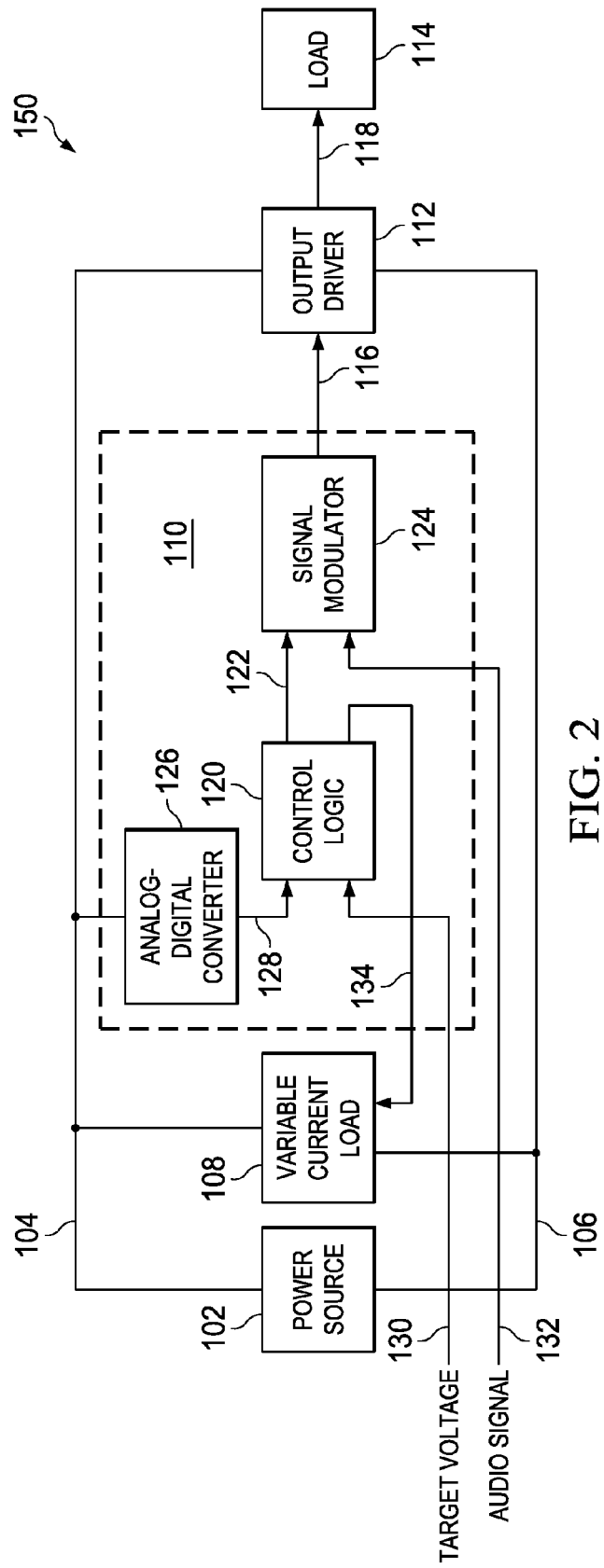
FIG. 2 is a block diagram of a supply compensation and noise reduction system.

FIG. 2 is a block diagram of a supply compensation and noise reduction system 150, which represents some embodiments of the system 100. The system 150 includes the power source 102, the variable current load 108, control logic 120, an amplitude correction signal 122, an ADC 126, a digitized representation of the supply voltage signal 128 ("digital representation"), a signal modulator (e.g., a SDM) 124, the switch control signal 116, the output driver 112, the output load signal 118, a variable current load enable signal 134, and the load 114. The system 150 includes two additional signals: a target voltage signal 130 ("target voltage") and an audio signal 132. The target voltage 130 is provided to the control logic 120 and may originate as a signal from a source external to the system 150 or be generated within the present system 150 as a reference value against which to compare the output of the power source 102. The target voltage 130 is, in at least some embodiments, the nominal voltage of the power source 102. The audio signal 132 contains the audio information that is to be provided to the user of the audio device within which the system 150 is housed. Control logic 120 may be composed of components or subassemblies including, but not limited to, one or more processors, logic gates, transistors, etc. that are used to control circuit devices, monitor parameters, and measure voltages, currents, and signal levels to implement the functions attributed herein to the control logic 120. Control logic 120 may further include storage (e.g., random access memory, read-only memory) comprising executable code (e.g., software, firmware) programmed to enable a processor to perform some or all of the functions attributed herein to the control logic 120.

In operation, the power source 102 provides a supply voltage 104. As previously explained, the supply voltage 104 may vary with time if the variable current load 108 is actively drawing current. To monitor such fluctuations, the ADC 126 converts the supply voltage 104 to a digital representation 128 and provides the digital representation 128 to the control logic 120. The control logic 120 compares the digital representation 128 to the target voltage 130 to determine whether the supply voltage 104 is above, below, or at the target voltage 130. Based on this comparison, the control logic 120 generates an amplitude correction signal 122. The amplitude correction signal 122 may be generated in any suitable manner, but, in general, it provides information regarding the difference between the target voltage 130 and the supply voltage 104. For instance, in some embodiments, the control logic 120 generates the amplitude correction signal 122 by calculating a ratio of the digital representation 128 and the target voltage 130 (e.g., the nominal voltage of the power source 102). This ratio may be used by the remainder of the system 150 to correct the voltage provided to the load 114. In some embodiments, the control logic 120 generates the amplitude correction signal 122 by extrapolating multiple samples of the digital representation 128 so that it may predict a future value of the digital representation 128 (and, by extension, a future value of the supply voltage 104). This extrapolation accounts for the time delay introduced by the circuit 110 between the node at which the ADC 126 taps the supply voltage 104 and the load 114. Thus, for instance, the control logic 120 may extrapolate a future value of the digital representation 128, determine a ratio of the extrapolated digital representation 128 to the target voltage 130, and output an amplitude correction signal 122 reflecting this ratio. Other techniques for determining the amplitude correction signal 122 are contemplated and fall within the scope of this disclosure.

The signal modulator 124 (e.g., a sigma-delta modulator) accepts as inputs the amplitude correction signal 122 and the audio signal 132. The signal modulator 124 performs at least two functions. First, it modulates the audio signal 132 based on the amplitude correction signal 122. For instance, if the amplitude correction signal 122 indicates that the supply voltage 104 is or will be below the target voltage 130, the signal modulator 124 boosts the audio signal 132 accordingly to compensate. In at least some embodiments, the signal modulator 124 modulates the audio signal 132 by applying the amplitude correction signal 122 in its feedback loop. In other embodiments, the audio signal 132 is corrected prior to the signal modulator 124 with suitable circuitry to multiply the audio signal 132 with the amplitude correction signal 122. Other techniques are contemplated and included within the scope of this disclosure. Second, the signal modulator 124 reduces noise audible to the human ear by pushing noise above 100 kHz and thus beyond the human hearing range of 20 Hz-20 kHz. In some embodiments, the signal modulator 124 achieves such attenuation using, e.g., a high-pass filter with a suitable cutoff frequency. The signal modulator 124 generates the switch control signal 116, which may comprise one or more signals to control one or more switches in the output driver 112, thereby regulating the provision of the supply voltage 104 to the load 114. The scope of disclosure is not limited to signal correction by a sigma-delta modulator. Other signal correction techniques are contemplated—for instance, circuit logic logically positioned before the modulator that corrects the signal using the amplitude correction signal 122. Any component of the system that performs such signal correction using the amplitude correction signal generally may be referred to herein as "correction logic."

The output driver 112 is designed to drive the load 114. It may comprise, for instance, a common H-bridge circuit that regulates the coupling between the supply voltage 104 and the load 114 using a plurality of independently controllable switches. These switches are controlled by the switch control signal 116, which may, in some embodiments, comprise multiple switch control signals. The output driver 112 uses the supply voltage 104 and the switch control signal 116 from the signal modulator 124 to generate the output load signal 118 which drives the load 114. The load 114 is coupled to the output driver 112 and generates an audio signal for reception by the wearer through the ear.

The modulator operates by converting the multi-bit input signal at a lower sampling frequency to a single-bit output signal at a higher sampling frequency. Each output bit provides approximately the energy of the squared supply voltage (at that moment) divided by the load resistance. Because high-frequency energy is partly absorbed by the audio transducer and also is not audible to the human ear, the audible audio output signal is thus a smoothed-out version of the modulator's single-bit data stream. By increasing the audio output signal of the output driver when the supply voltage is low, the amplitude of the audio signal provided to the audio transducer remains at the desired level.

Figure 3:
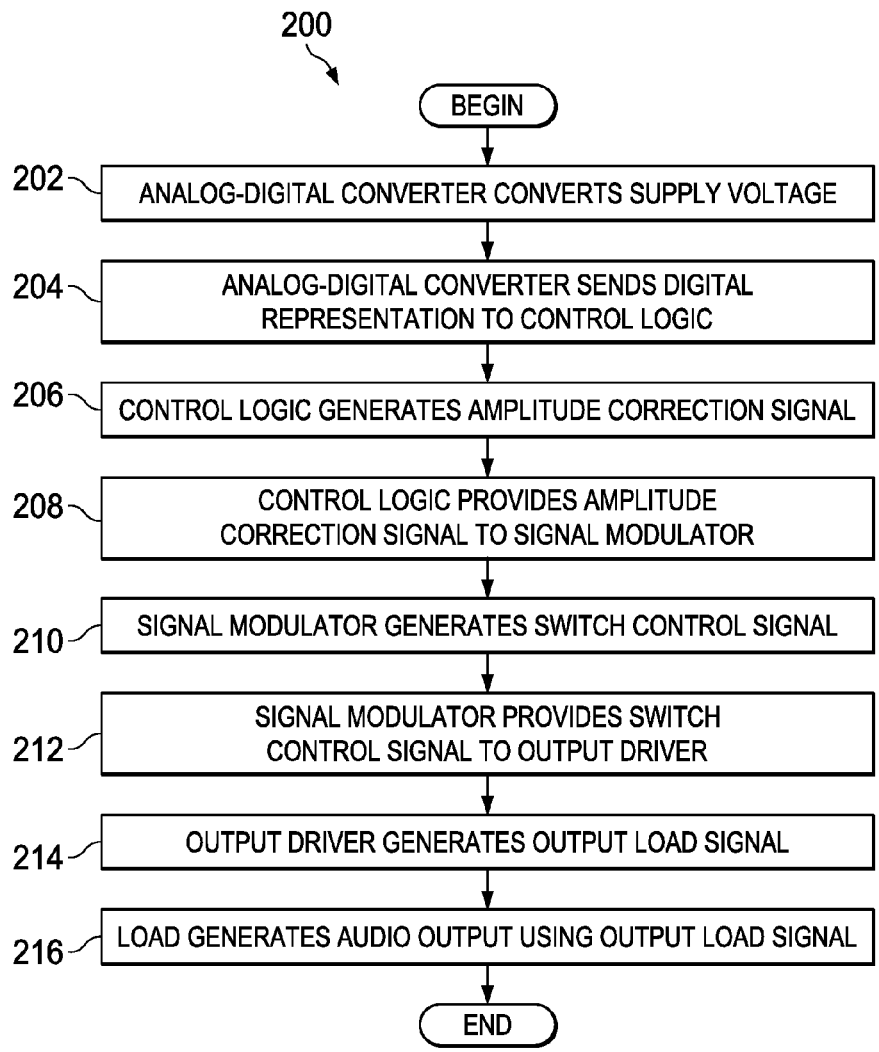
FIG. 3 is a flow diagram of a supply compensation and noise reduction process.

FIG. 3 is a flow diagram of a supply compensation and noise reduction process 200. The process includes a block 202 in which the ADC converts the analog supply voltage to a digital representation. In block 204, the ADC sends the digital representation of the supply voltage to the control logic for processing. Next, as seen in block 206, the control logic generates the amplitude control signal using the digital representation of the supply voltage and the target voltage. At block 208, the control logic provides the amplitude correction signal to the signal modulator. In block 210, the signal modulator generates the switch control signal using the amplitude correction signal and the audio signal as inputs. In block 212, the signal modulator provides the switch control signal to the output driver. In block 214, the output driver generates the output load signal using the switch control signal and the supply voltage. In block 216, the output driver provides the output load signal to the load in order for the load to generate an audio output to be heard by the wearer. The process then ends, or it may be repeated.

As previously alluded, the circuit 110 may require some time to determine the degree of correction needed to compensate for disturbances in the supply voltage and to apply that correction at the load 114. As a result, the response of the circuit 110 may lag behind fluctuations in the actual supply voltage. The correction applied at the load 114 may be "too late," meaning that the supply voltage fluctuation that the circuit 110 was intended to correct has already passed by the time the correction is applied at the load 114, and a new supply voltage value will be present. Accordingly, in at least some embodiments, the circuit 110 may use sampled supply voltage values to predict future supply voltage values and may use such predicted values to determine the correction to be applied at the load 114. In this way, the response lag of the circuit 110 is mitigated, and the correction applied at the load 114 is more timely than would otherwise be the case.

Figure 4:
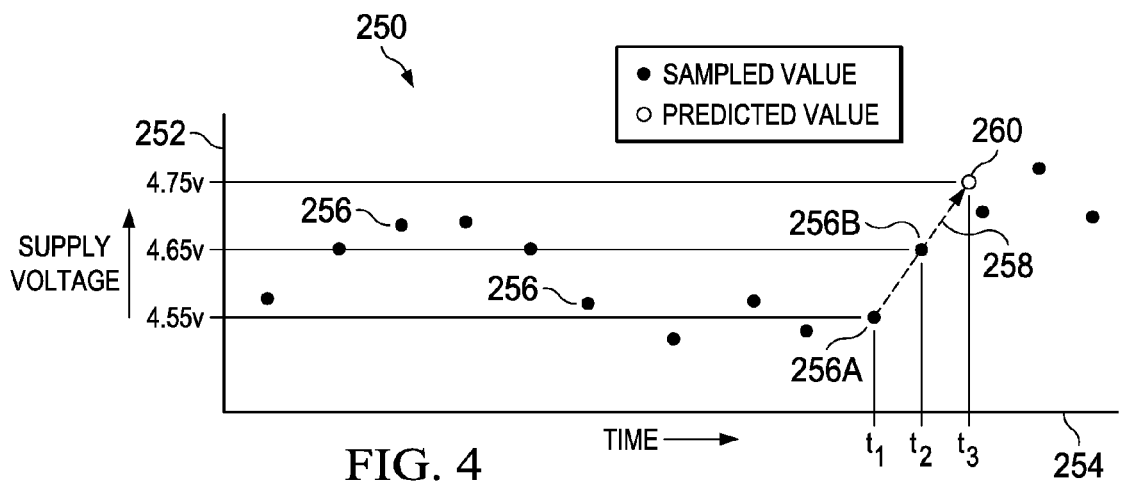
FIG. 4 is a graph representing supply voltage values and predicted future supply voltage values.

FIG. 4 is a graph 250 representing supply voltage values sampled by the circuit 110 and future supply voltage values predicted by the circuit 110. The graph 250 shows supply voltage values 252 on the y-axis as a function of time 254 on the x-axis. The circuit 110 samples multiple supply voltage values 256 over time. It determines a slope 258 between two or more of the sampled supply voltage values 256 and, based on that slope, predicts a future supply voltage value. For instance, the circuit 110—and, more specifically, the control logic 120—may calculate the slope 258 of the line between sampled supply voltage values 256A and 256B. It may then use that slope 258 to predict a subsequent supply voltage value 260. In at least some embodiments, the predicted value 260 lies along the same slope 258 as values 256A and 256B, although the scope of disclosure is not limited as such, and the control logic 120 may adjust the calculated slope 258 based on any suitable number and types of factors when predicting the value 260. The control logic 120 may be programmed with the time lag typically introduced by part or all of the circuit 110 and may use this lag to determine the future point in time for which a predicted supply voltage value is necessary. The predicted value 260 may be used by the control logic 120 in its generation of an amplitude correction signal 122. This approach provides for a more accurate correction of the supply voltage.

As an example, the first supply voltage measurement 256A at time $t_1$ is 4.55 volts while the second voltage measurement 256B at time $t_2$ is 4.65 volts. The control logic 120 is programmed with the time lag introduced by the circuit 110, which in this example means that a supply voltage prediction is needed for a future time $t_3$. Based on the slope of the line between these two voltage points in time, the control logic 120 will estimate that a future supply voltage 260 at time $t_3$ should be 4.75 volts. In this example, because the supply voltage is rising, it is probable that the future supply voltage at time $t_3$ will be closer to 4.75 volts than 4.65 volts, which is the value that would otherwise have been used by the control logic 120 absent this voltage prediction technique. Thus, the control logic 120 will have access to more accurate data in its calculations in generating an amplitude correction signal 122.

Figure 5:
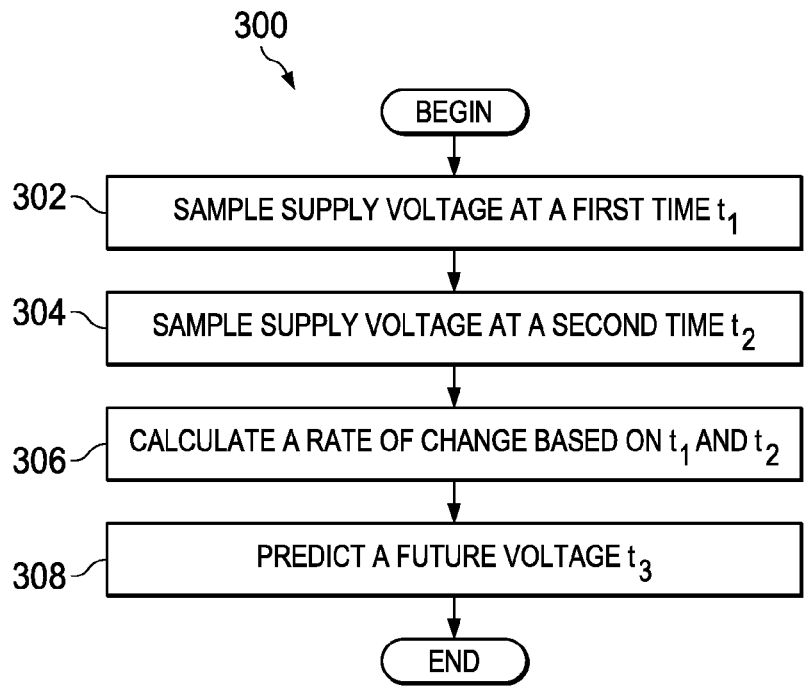
FIG. 5 is a flow diagram of a process to predict future supply voltage values.

FIG. 5 is a flow diagram of a process 300 to predict future supply voltage values. The process 300 begins with taking a first sample of the supply voltage at a first time $t_1$ and recording the value as shown in block 302. Next, at block 304, a second sample of the supply voltage is taken at a second time $t_2$ and recorded. At block 306, the process 300 comprises determining the rate of change (i.e., slope) of the sampled supply voltages between times $t_1$ and $t_2$. In block 308, the process 300 comprises calculating a predicted future supply voltage at a specified time $t_3$ based on the aforementioned rate of change as calculated in block 306.

The method then ends or is repeated as required. As explained above, the predicted supply voltage value is generally more likely to accurately reflect the actual supply voltage present at the load 114 when the circuit 110 applies its correction to the load 114. Thus, the circuit 110 more effectively corrects the fluctuations in the supply voltage provided by the power source.

Figure 6:
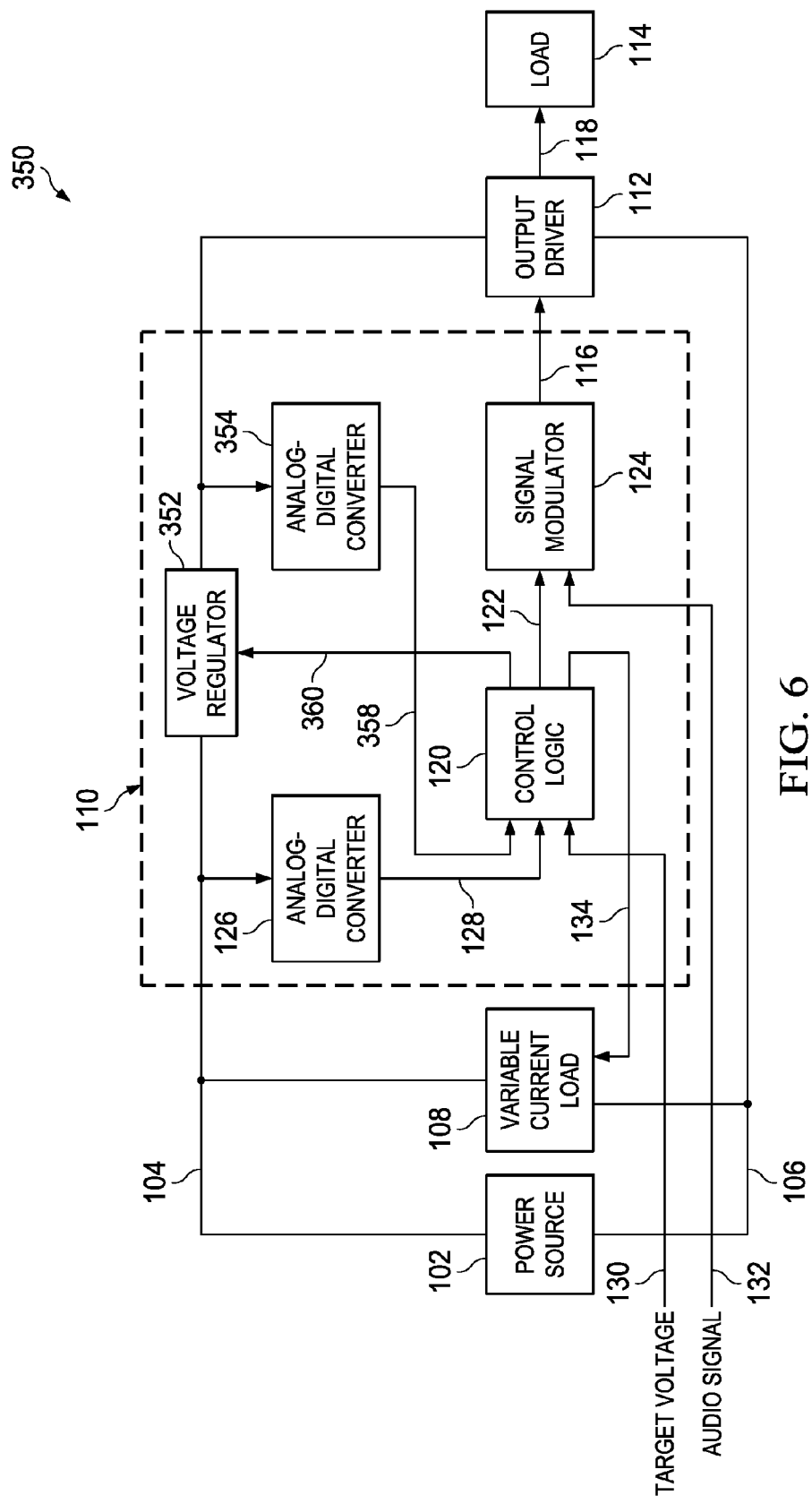
FIG. 6 is a block diagram of a supply compensation and noise reduction system employing a voltage regulator.

FIG. 6 is a block diagram of a system 350 including a voltage regulator 352 within the circuit 110. A voltage regulator takes in a fluctuating voltage and outputs a constant voltage. Voltage regulators are commonly known and may include, for instance, an operational amplifier that controls the gate voltage of a MOS transistor, which controls the current between unregulated and regulated voltage supplies. The voltage regulator 352 is coupled to both the power source 102 and the output driver 112 to provide the load 114 with a regulated voltage that is less than the voltages between which the fluctuating supply voltage 104 fluctuates. In this way, the regulated voltage provided to the load 114 is steadier than it would be otherwise. The circuit 110 includes multiple ADCs 126 and 354. The ADC 126 generates a digital representation 128 of the supply voltage 104 as it is provided by the power source 102—that is, the voltage prior to regulation by the voltage regulator 352. The ADC 354 generates a digital representation 358 of the regulated voltage output by the voltage regulator 352. Both of these digital representations 128, 358 are provided as inputs to the control logic 120.

The control logic 120 uses the digital representation 128 to determine whether and to what degree voltage regulation by the voltage regulator 352 is required. In at least some embodiments, the control logic 120 can enable and disable the variable current load 108 via a variable current load enable signal 134, and if the load 108 is disabled, the control logic 120 can disable the voltage regulator 352 via a voltage regulator enable signal 360 because no significant supply voltage fluctuations will be present. However, other components of the system 350 (e.g., other variable current loads not controlled by the control logic 120) may cause the supply voltage 104 to fluctuate, and in these instances the digital representation 128 of the ADC 126 enables the control logic 120 to determine whether voltage regulation is necessary (e.g., whether fluctuations of the supply voltage 104 exceed a predetermined threshold). If such regulation is necessary, the control logic 120 ensures that the voltage regulator 352 is enabled (e.g., via enable signal 360); otherwise, it disables the voltage regulator 352 (via enable signal 360).

When the voltage regulator 352 is enabled, the control logic uses the digital representation 128 to determine appropriate settings for the voltage regulator 352. For instance, if the control logic 120 determines that the supply voltage 104 consistently or almost consistently (i.e., for more than a predetermined percentage of samples—for instance, for more than 95% of samples) fluctuates within a range of 4.9 volts to 5.0 volts, the control logic 120 may cause the voltage regulator 352 to output a comparatively steady, regulated voltage of 4.80 volts. In such embodiments, it is the control logic 120 that dictates the regulated voltage to be produced by the voltage regulator 352 and, in such embodiments, the target voltage 130 is unnecessary because the control logic 120 has already determined for itself the desired output of the voltage regulator 352. In other embodiments, the control logic 120 uses the target voltage 130 to set the regulated voltage produced by the voltage regulator 352, since these values should be the same. In such embodiments, the control logic 120 might not use the digital representation 128 from the ADC 126 to determine the desired output of the voltage regulator 352, but the control logic 120 may still use the digital representation 128 from the ADC 126 to determine whether the supply voltage 104 fluctuations are significant enough (e.g., beyond a predetermined threshold) to warrant regulation at all.

Figure 7:
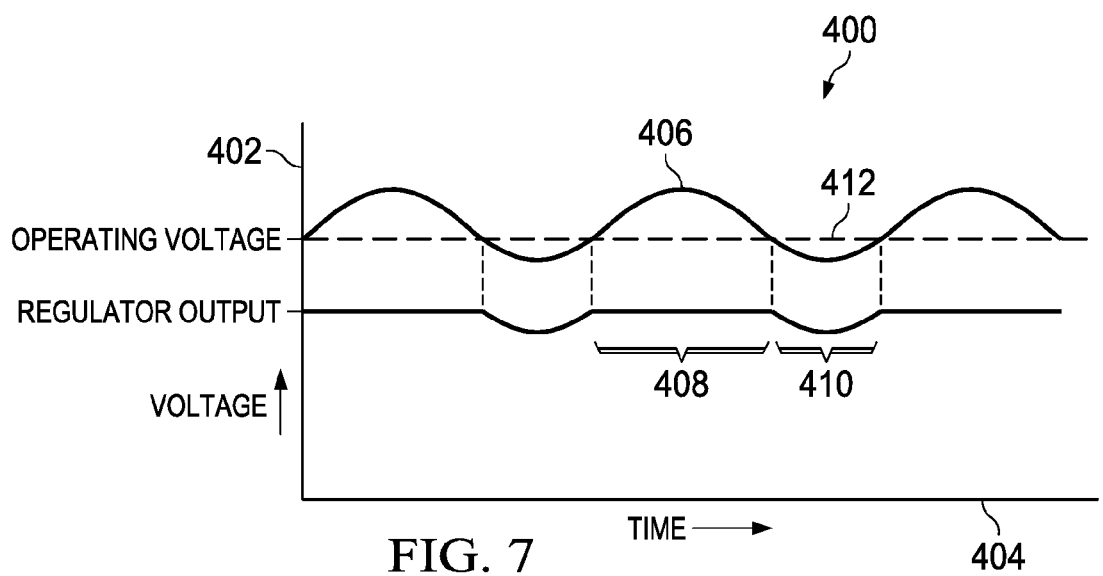
FIG. 7 is a graph representing input and output voltage values of a voltage regulator.

FIG. 7 is a graph 400 representing input and output voltage values of the voltage regulator 352 of FIG. 6, as well as the operating voltage of the voltage regulator 352. The graph plots voltage values 402 on the y-axis over time 404 on the x-axis. The voltage regulator input voltage 406—that is, the supply voltage 104 of FIG. 6—is shown as a fluctuating voltage level that exists both above and below the voltage regulator's operating voltage 412. Whenever the input voltage 406 is at or above the operating voltage 412, the regulator output voltage is a constant, predetermined voltage 408. However, whenever the input voltage 406 drops below the operating voltage 412, the output of the voltage regulator drops as well, as reference number 410 indicates. As explained above, the predetermined output voltage 408 of the voltage regulator 352 is selected to be slightly below the range within which the supply voltage 104 fluctuates. For instance, if the supply voltage 104 fluctuates between 4.9 volts and 5.0 volts, the predetermined output voltage 408 may be selected to be 4.8 volts. Accordingly, the voltage regulator 352 is, in at least some embodiments, chosen or built so that its operating voltage is between the predetermined output voltage 408 and the fluctuation range—e.g., in the running example, at 4.85 volts. In some embodiments, the regulated voltage level can be adjusted to be at the minimum voltage below the supply voltage that still facilitates the desired power supply rejection ratio and maximum power efficiency. This value may decrease as the supply voltage decreases (e.g., as supply capacity is reduced).

Referring again to FIG. 6, the control logic 120 uses the digital representation 358 from the ADC 354 in the same manner as it uses the digital representation 128 from the ADC 126 in FIG. 2. Specifically, the control logic 120 uses the digital representation 358 to determine the amplitude correction signal 122. The manner in which the amplitude correction signal 122 is determined is explained in detail above and is thus not repeated here. The degree to which amplitude correction is required in the system 350 should be less in comparison to systems lacking a voltage regulator, since the voltage regulator outputs a generally steady, regulated voltage. Amplitude correction is necessary, however, when the voltage regulator 352 fails to hold its output voltage at the desired level. In addition, amplitude correction may be necessary when the voltage regulator 352 is being activated—that is, when the system is transitioning from an unregulated supply to a regulated supply. In general, the ADC 354 preferably remains active when it is known or expected that the supply voltage will be fluctuating or is likely to be fluctuating. In some embodiments, if the battery supply voltage is determined to be stable, the voltage regulator may be deactivated and, in such cases, the ADC 354 and/or the ADC 126 preferably remain(s) active to compensate for fluctuations in the battery supply. In some embodiments of the system 350, the control logic 120 may implement the voltage prediction technique as described above.

Figure 8:
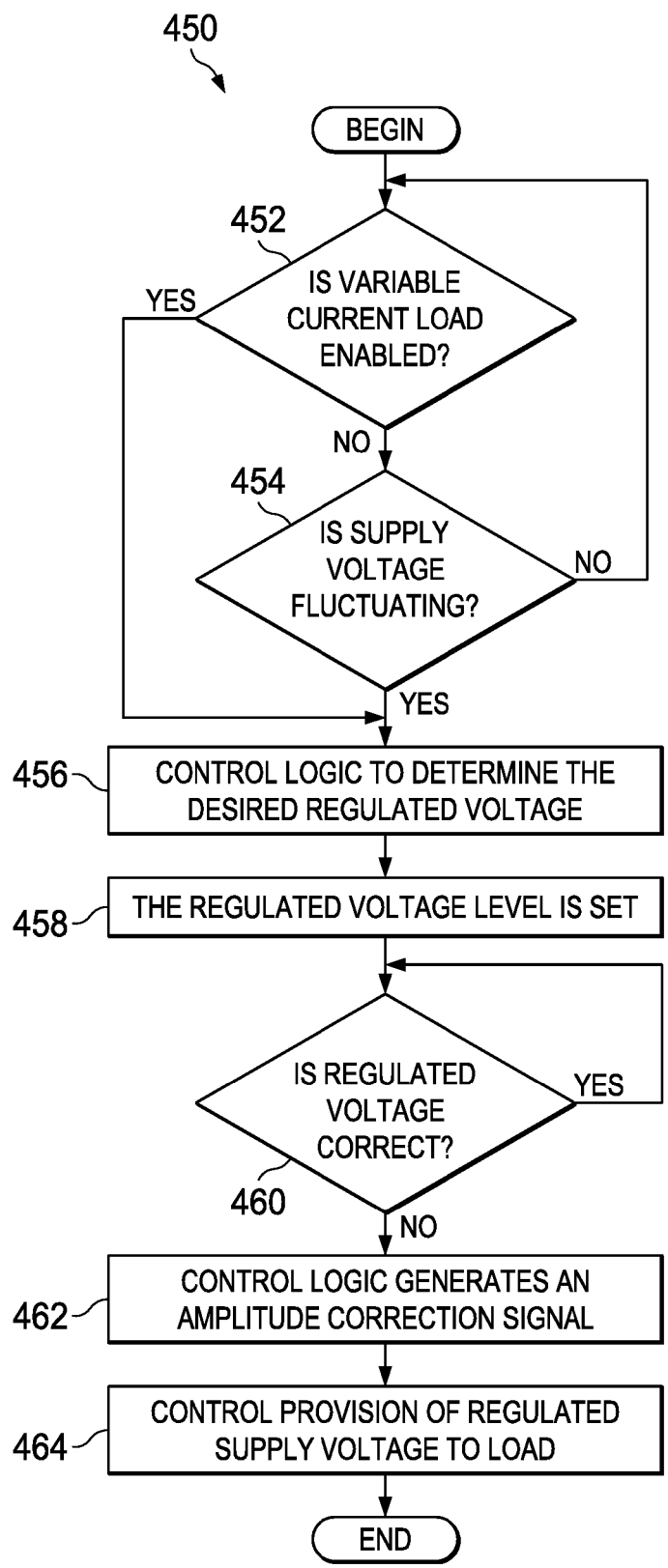
FIG. 8 is a flow diagram of a supply compensation and noise reduction process using a voltage regulator.

FIG. 8 is a flow diagram of a supply compensation and noise reduction process 450 using a voltage regulator. The process 450 begins by determining whether a variable current load is enabled (block 452) or whether the supply voltage is fluctuating beyond a predetermined threshold (block 454). If neither of these conditions is present, control of the process 450 loops back to block 452. Otherwise, if either condition is present, voltage regulation is necessary. Accordingly, the process 700 comprises the control logic 120 using the target voltage or the output of an ADC that is positioned before the voltage regulator (e.g., ADC 126 in FIG. 6) to determine the desired regulated voltage to be provided by the voltage regulator 352 (block 456). As explained, this step may be performed by setting the output of the voltage regulator 352 using an externally-received target voltage, or it may be performed by identifying a suitable voltage value that is below the fluctuation range of the supply voltage 104 as indicated by the ADC 126. The regulated voltage output by the voltage regulator 352 is set accordingly (block 458). The process 450 further comprises using the output of another ADC positioned after the voltage regulator (e.g., ADC 354 in FIG. 6) to determine whether the regulated voltage provided by the voltage regulator matches the desired output of the voltage regulator (block 460). If it does, control of the process 450 loops back to block 460. Otherwise, if a mismatch exists, the process 450 includes generating an amplitude correction signal as described above (block 462) and using the amplitude correction signal to control provision of the regulated supply voltage to the load (block 464), also as described above. This monitoring and correction of the supply voltage occurs during the transition from a non-regulated supply to a regulated supply as well as after the transition (e.g., if the voltage regulator fails to hold its output voltage at the desired level, or when the regulated voltage level is adjusted, or when returning to a non-regulated supply).

Figure 9A:
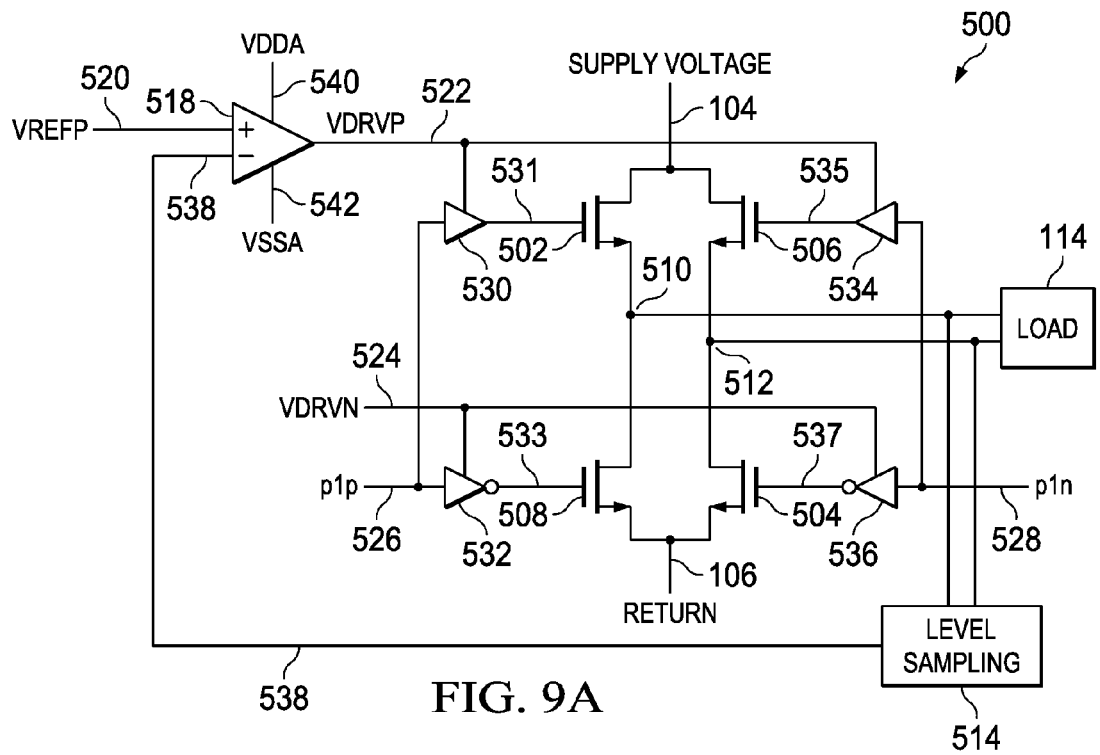
FIG. 9A is a schematic diagram of an output driver circuit.

In some embodiments, the supply voltage provided to the load 114 may be regulated at the output driver 112 without the use of the voltage regulator or amplitude correction signals described above. In such embodiments, the output driver may comprise an H-bridge circuit 500 (e.g., a Class-D amplifier) as shown in FIG. 9A. The circuit 500 includes four switches 502, 504, 506 and 508; the supply voltage 104; the supply voltage return line 106; a comparator (e.g., error amplifier) 518; a reference voltage VREFP 520; the comparator output VDRVP 522, which is a variable signal; the signal VDRVN 524, which is a constant voltage; buffers 530, 534; inverters 532, 536; the control signals p1$p$ 526, p1$n$ 528; gate control signals 531, 533, 535 and 537; level sampling circuit 514; level sampling circuit output 538; and comparator supplies VDDA 540, VSSA 542. The load 114 and the level sampling circuit 514 couple in parallel to nodes 510, 512.

In operation, the comparator 518 compares the signals 520, 538 and produces the output signal VDRVP 522. Accordingly, VDRVP 522 is variable. VDRVP 522 is provided to buffers 530, 534, which receive control signals p1$p$ 526, p1$n$ 528, respectively. Thus, each of the gate control signals 531, 535 may swing between 0V and VDRVP. These gate control signals 531, 535 control switches 502, 506, respectively. The inverters 532, 536 receive VDRVN 524, which is a constant voltage. They also receive control signals p1$p$ 526, p1$n$ 528, respectively. They output gate control signals 533, 537, respectively. The gate control signals 533, 537 control switches 508, 504, respectively. Each of the gate control signals 533, 537 can swing between 0V and VDRVN. Together, the four switches regulate the supply voltage applied across the nodes 510, 512. This voltage, in turn, is applied to the load 114 and is also provided to the level sampling circuit 514. The level sampling circuit 514 outputs a previously-stored voltage 538 as an input to the comparator 518. The level sampling circuit 514 and the comparator 518 form a regulation loop that ensures that the high level voltages across nodes 510, 512 are equal to the reference voltage VREFP 520.

Figure 9B:
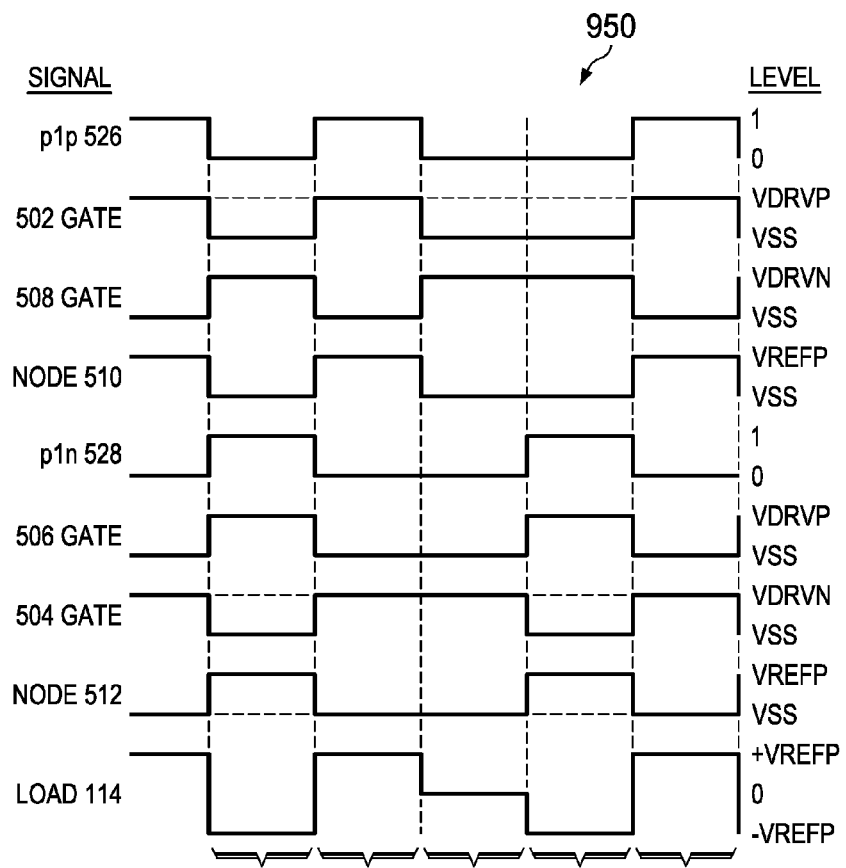
FIG. 9B is a timing diagram associated with the circuit of FIG. 9A.

FIG. 9B shows a timing diagram 950 for the circuit 500 of FIG. 9A. The timing diagram 950 includes five consecutive time periods 952, 954, 956, 958 and 960. During time period 952, p1$p$ 526 is LOW and p1$n$ 528 is HIGH. Accordingly, the voltage at the gate for switch 502 is at VSS (e.g., 0V), the voltage at the gate for switch 508 is at VDRVN (due to inverter 532), the voltage at the gate for switch 506 is at VDRVP, and the voltage at the gate for switch 504 is at VSS (e.g., 0V, due to inverter 536). As a result, the voltage across nodes 510 and 512 (and, thus, at load 114) is −VREFP, as shown.

During time period 954, p1$p$ 526 is HIGH; p1$n$ 528 is LOW; the voltages at the gates for switches 502, 508, 506, and 504 are VDRVP, VSS, VSS, and VDRVN, respectively; and the voltage across nodes 510 and 512 (and, therefore, across load 114) is +VREFP. During time period 956, p1$p$ 526 is LOW and p1$n$ 528 is LOW; the voltages at the gates for switches 502, 508, 506 and 504 are VSS, VDRVN, VSS, and VDRVN, respectively; and the potential across nodes 510 and 512 (and, thus, across the load 114) is 0V.

During time period 958, p1$p$ 526 is LOW and p1$n$ 528 is HIGH; the voltages at the gates for switches 502, 508, 506 and 504 are VSS, VDRVN, VDRVP, and VSS, respectively; and the voltage across nodes 510 and 512 (and, thus, across load 114) is −VREFP. Finally, during time period 960, p1$p$ 526 is HIGH and p1$n$ 528 is LOW; the voltages at the gates for switches 502, 508, 506 and 504 are VDRVP, VSS, VSS, and VDRVN, respectively; and the voltage across nodes 510 and 512 (and, thus, across load 114) is +VREFP, as shown.

Figure 9C:
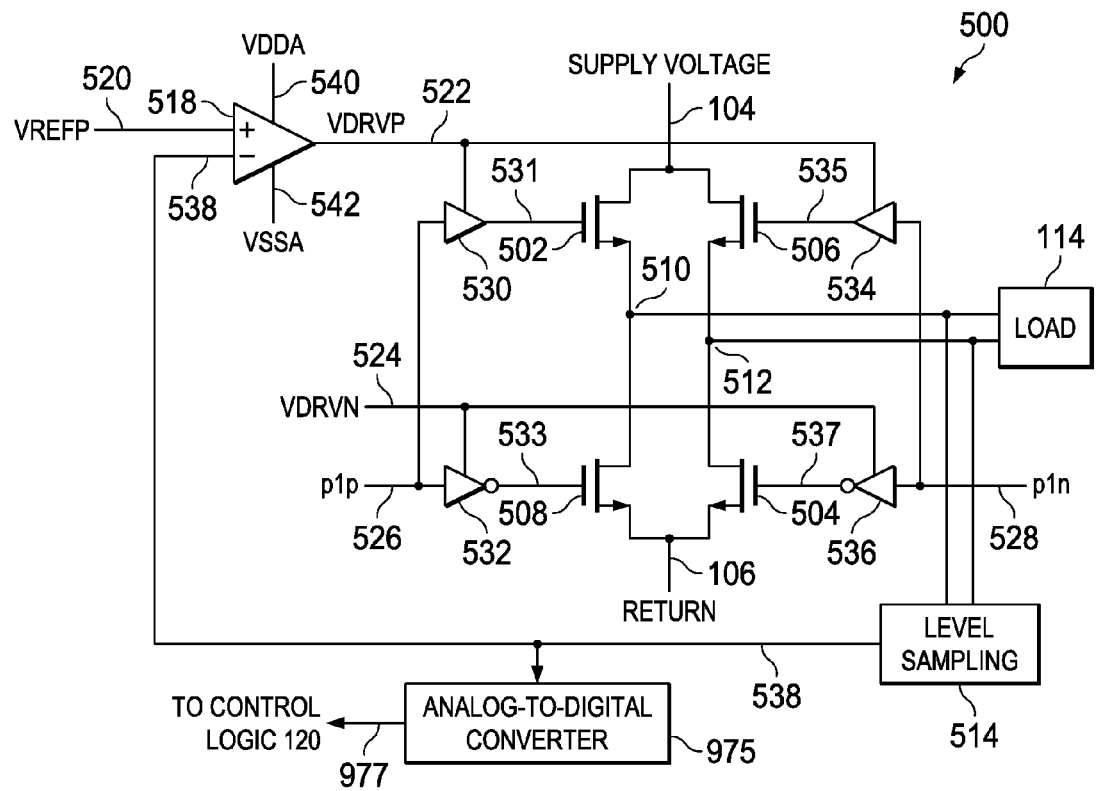
FIG. 9C is a schematic diagram of an output driver circuit with an analog-to-digital converter.

FIG. 9C depicts a variation of the output driver circuit 500 of FIG. 9A with an analog-to-digital converter (ADC). Specifically, an ADC 975 receives input signals from level sampling circuit output 538, converts the input signals to digital form, and provides the output digital signals to control logic 120 (e.g., FIG. 6) via connection 977. In at least some such embodiments, the voltage regulator 352 and ADC 354 are omitted. In these embodiments, the control logic 120 receives as inputs the output of the ADC 126, the target voltage signal 130, and the output of the ADC 975. The control logic 120 uses these inputs to produce the output signal 122 that controls the signal modulator 124, similar to the manner described above.

Figure 10:
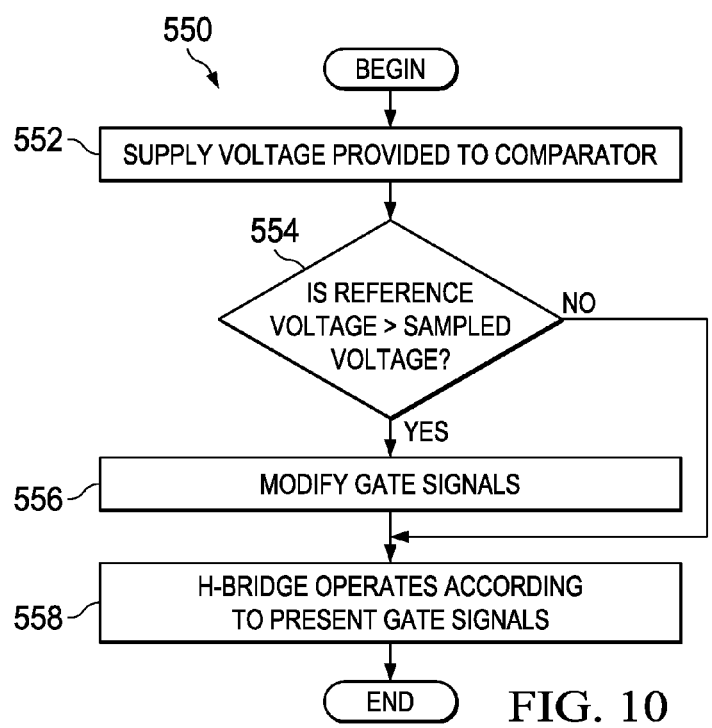
FIG. 10 is a flow diagram of a supply compensation and noise reduction process employing the output driver of FIG. 9A.

FIG. 10 is a flow diagram of a supply compensation and noise reduction process 550 employing the output driver 500 of FIG. 9A. The method 550 begins at block 552, where the sampled voltage output 516 is provided to the comparator 518. The comparator 518 compares the sampled voltage 516 to the reference voltage 520 to determine whether the reference voltage is greater than the sampled voltage (block 554). If the reference voltage is not greater than the sampled voltage, there are no substantial supply voltage fluctuations present and the H-bridge circuit 500 continues to operate according to its present gate signals (block 558). However, if the reference voltage is greater than the sampled voltage, the supply voltage is likely fluctuating, and the gate signals controlling the various switches of the circuit 500 are modified so that the voltage supplied to the load increases (block 556), and the circuit 500 then operates according to these gate signals (block 558).

Numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. An electronic system, comprising:
    a power source;
    a load coupled to the power source;
    an analog-to-digital converter, coupled to the power source and the load, that samples a fluctuating voltage supplied by the power source and generates a digital representation of said fluctuating voltage;
    control logic, coupled to the analog-to-digital converter, that generates an amplitude correction signal based on said digital representation of the fluctuating voltage and on a target voltage;
    correction logic, coupled to the control logic, that uses the amplitude correction signal and an audio signal to generate a switch control signal; and
    an output driver, coupled to the correction logic, that controls coupling between the power source and the load based on the switch control signal.

2. The system of claim 1, wherein said output driver comprises a Class-D amplifier.

3. The system of claim 1, further comprising a variable current load that causes said fluctuating voltage to fluctuate.

4. The system of claim 1, wherein the correction logic comprises a sigma-delta modulator.

5. The system of claim 1, wherein the output driver comprises an H-Bridge circuit.

6. The system of claim 1, wherein the switch control signal is a digital 1-bit bit stream.

7. The system of claim 1, further comprising a voltage regulator, coupled between the power source and the load, to provide the load with a regulated voltage that is less than voltages between which the fluctuating voltage fluctuates.

8. The system of claim 7, wherein the voltage regulator is disabled when a variable current load in the system is disabled, and wherein the voltage regulator is enabled when said variable current load is enabled.

9. The system of claim 1, wherein the control logic generates the amplitude correction signal based at least in part on an extrapolation of multiple digitized samples of the fluctuating voltage.

10. The system of claim 1, wherein the control logic generates the amplitude correction signal at least in part by determining or approximating a ratio of said digital representation and a nominal voltage from the power source.

11. An electronic system, comprising:
    a variable current load;
    a power source, coupled to the variable current load, that provides a fluctuating voltage due at least in part to the variable current load;
    a second load;
    one or more switches to control coupling between the power source and the second load;
    a sampling system, coupled to the second load, to sample a voltage provided to the second load; and
    a comparator, coupled to the sampling system, that uses the sampled voltage and a reference voltage to generate a switch control signal that controls the one or more switches.

12. The system of claim 11, wherein the one or more switches comprise n-type metal oxide semiconductor field effect transistor (n-MOSFET) switches.

13. The system of claim 11, wherein the sampling system comprises a sample and hold switch and at least one capacitor.

14. The system of claim 11, wherein the sampling system samples the voltage provided to the second load comprises positive and negative signal levels as referenced to 0 volts and wherein the sampling system only samples the positive signals.

15. The system of claim 11, wherein the second load is an audio speaker.

16. The system of claim 11, wherein the electronic system is a hearing aid device that is at least partially inserted into a human ear.

17. The system of claim 11, wherein the power source is a portable source such as a battery.

18. The system according to claim 11, further comprising a voltage regulator, coupled in between the power source and the output driver, to provide the second load with a regulated voltage that is less than voltages between which the fluctuating voltage fluctuates.

19. An audio noise reduction method, comprising:
    taking a first measurement of a power source voltage at a first time;
    taking a second measurement of said power source voltage at a second time;
    calculating a rate of change based on said first and second voltage measurements;
    predicting a future power source voltage based on said rate of change;
    generating an amplitude correction signal based on the future power source voltage and a target load voltage;
    generating a switch control signal using the amplitude correction signal and an audio signal; and
    controlling one or more switches using the switch control signal to regulate the provision of power to a load.

20. The method of claim 19, further comprising using one or more decoupling capacitors in tandem with said power source.

21. The method of claim 19, further comprising using a voltage regulator to maintain said power provided to the load at a level that is less than the voltage range within which the power source voltage fluctuates.

* * * * *